United States Patent
Bar-Or et al.

(10) Patent No.: US 9,064,585 B2
(45) Date of Patent: Jun. 23, 2015

(54) PRELOADING DATA INTO A FLASH STORAGE DEVICE

(71) Applicant: SANDISK IL LTD., Kfar Saba (IL)

(72) Inventors: Shahar Bar-Or, Ra'anana (IL); Dan Inbar, Yehud (IL); Ori Moshe Stern, Modeen (IL); Yigal Eli, Petach Tikva (IL)

(73) Assignee: SANDISK IL LTD., Kfar Saba (IL)

( * ) Notice: Subject to any disclaimer, the term of this patent is extended or adjusted under 35 U.S.C. 154(b) by 0 days.

(21) Appl. No.: 14/257,731

(22) Filed: Apr. 21, 2014

(65) Prior Publication Data

US 2014/0229664 A1    Aug. 14, 2014

Related U.S. Application Data

(63) Continuation of application No. 13/123,945, filed as application No. PCT/IB2009/007044 on Oct. 5, 2009, now Pat. No. 8,743,629.

(60) Provisional application No. 61/238,620, filed on Aug. 31, 2009.

(51) Int. Cl.
*G11C 7/22*        (2006.01)
*G11C 16/14*       (2006.01)
(Continued)

(52) U.S. Cl.
CPC ............ *G11C 16/14* (2013.01); *G11C 11/5628* (2013.01); *G11C 16/102* (2013.01); *G11C 2211/5641* (2013.01)

(58) Field of Classification Search
CPC ... G11C 16/26; G11C 7/1006; G11C 11/5628
USPC ........................................ 365/189.14, 185.18
See application file for complete search history.

(56) References Cited

U.S. PATENT DOCUMENTS 5,657,332 A    8/1997  Auclair et al.
5,930,167 A    7/1999  Lee et al.
(Continued)

FOREIGN PATENT DOCUMENTS

JP    2006114078 A    4/2006

OTHER PUBLICATIONS

International Search Report and Written Opinion mailed Nov. 13, 2009 in International Application No. PCT/IB2009/006632, 14 pages.

(Continued)

*Primary Examiner* — Tuan T Nguyen
(74) *Attorney, Agent, or Firm* — Toler Law Group, PC (57) ABSTRACT

Programmer's data that is transferred from a programming device to a storage device is initially stored in a memory device of the storage device by using a durable data-retention storage setup. After the storage device is embedded in a host device, the programmer's data is internally (i.e., in the storage device) read from the memory device and rewritten into the memory device by using a conventional storage setup. Using a durable data-retention storage setup may include temporarily (i.e., before the storage device is embedded in a host) operating selected memory cells of the memory device as conventional SBC cells or as unconventional MBC cells. After the storage device is embedded in a host device, the programmer's data, or selected parts thereof, is read from the memory device and rewritten into it by operating selected memory cells of the memory device as conventional MBC cells.

20 Claims, 6 Drawing Sheets

(51) Int. Cl.
  *G11C 11/56*   (2006.01)
  *G11C 16/10*   (2006.01)

(56) References Cited

U.S. PATENT DOCUMENTS

| | | | |
|---|---|---|---|
| 6,522,580 B2 | 2/2003 | Chen et al. | |
| 6,606,707 B1 | 8/2003 | Hirota et al. | |
| 6,785,767 B2 | 8/2004 | Coulson | |
| 6,851,013 B1 | 2/2005 | Larsen et al. | |
| 7,002,853 B2 * | 2/2006 | Kozakai et al. | 365/189.14 |
| 7,149,111 B2 * | 12/2006 | Murin et al. | 365/185.03 |
| 7,386,653 B2 | 6/2008 | Moran | |
| 7,643,342 B2 | 1/2010 | Litsyn et al. | |
| 7,924,648 B2 * | 4/2011 | Sokolov et al. | 365/230.03 |
| 8,254,170 B2 | 8/2012 | Eli et al. | |
| 2001/0052092 A1 | 12/2001 | Matsushita | |
| 2002/0051394 A1 | 5/2002 | Tobita et al. | |
| 2005/0007801 A1 | 1/2005 | Barzilai et al. | |
| 2007/0089034 A1 | 4/2007 | Litsyn et al. | |
| 2007/0133249 A1 | 6/2007 | Roohparvar | |
| 2007/0159892 A1 | 7/2007 | Kang et al. | |
| 2007/0211532 A1 | 9/2007 | Gonzalez et al. | |
| 2007/0242527 A1 | 10/2007 | Shibata | |
| 2008/0112221 A1 | 5/2008 | Park et al. | |
| 2008/0175055 A1 | 7/2008 | Kim | |
| 2008/0205136 A1 | 8/2008 | Wang et al. | |
| 2008/0263265 A1 | 10/2008 | Litsyn et al. | |
| 2008/0263266 A1 | 10/2008 | Sharon et al. | |
| 2009/0003058 A1 | 1/2009 | Kang | |
| 2009/0292972 A1 | 11/2009 | Seol et al. | |
| 2011/0228604 A1 | 9/2011 | Eli et al. | |

OTHER PUBLICATIONS

International Preliminary Report on Patentability issued Feb. 28, 2012 in International Application No. PCT/IB2009/006632, 7 pages.
Office Action issued Mar. 5, 2014 in Chinese Application No. 200980161096.7 with English translation, 9 pages.
International Search Report and Written Opinion for International Application No. PCT/IB2009/007044, mailed May 4, 2010, 16 pages.
International Preliminary Report on Patentability for International Application No. PCT/IB2009/007044, mailed Mar. 15, 2012, 9 pages.
Restriction Requirement mailed Oct. 9, 2013 in U.S. Appl. No. 13/123,945, 7 pages.
Notice of Allowance and Fee(s) Due mailed Jan. 21, 2014 in U.S. Appl. No. 13/123,945, 8 pages.

* cited by examiner

PRELOADING DATA INTO A FLASH STORAGE DEVICE

CROSS-REFERENCE TO RELATED APPLICATIONS

This application is a continuation of and claims priority to U.S. application Ser. No. 13/123,945 filed Apr. 13, 2011 (issued as U.S. Pat. No. 8,743,629), which is a U.S. National Stage Application of and claims priority to International Application No. PCT/IB09/07044 filed Oct. 5, 2009, which claims priority to U.S. Provisional Application No. 61/238,620 filed Aug. 31, 2009. The contents of each of these applications are incorporated by reference herein in their entirety.

FIELD OF THE DISCLOSURE

The present invention generally relates to flash storage devices and more specifically to a method for preloading data to a flash storage device and to a storage device that uses the method.

BACKGROUND

Use of flash storage devices has been rapidly increasing over the years because they are portable and they have small physical size and large storage capacity. Flash storage devices come in a variety of designs. Some storage devices are regarded as "removable" which means that a user can move them from one host device to another or replace one storage device with another. Other storage devices are regarded as "embedded" which means that they cannot and are not intended to be removed by the user from a host device with which they operate. For various reasons, manufacturers of embedded storage devices preload user data into storage devices before they are incorporated into the hosts. In general, user data is preloaded into the storage device before a host is distributed to an end user with the storage device embedded in it. Global Positioning System ("GPS") maps, music files, video files, video games, and the like, are examples of user data.

Memory cells that are operated as Single-Bit per Cell ("SBC") cells are known for having higher data-retention durability than memory cells that are operated as Multi-Bit per Cell ("MBC") cells. However, user data is traditionally stored in memory cells that are operated as MBC cells because user data are typically large (e.g., in the order of hundreds of megabytes to gigabytes), and storing them compactly in MBC cells saves storage space.

Typically, a storage device is embedded in a host device by using a reflow soldering process. MBC cells with the preloaded user data are susceptible to possible effects of the heat generated from the reflow soldering process and the data in them may be altered as a result, particularly because of the relatively small error margins that exist between the different binary states of the memory cells (i.e., smaller error margins than those between binary states in SBC cells). In other words, excess heat that is generated as a result of the reflow process decreases the threshold voltage levels of the memory cells, thus causing them to unintentionally transition from designated binary states to other (i.e., erroneous) binary states.

There is therefore a need to address the problem of reflow-induced discharge of electric charge in memory cells when a storage device is embedded in a host device. There is also a need to preload user data to MBC cells and, at the same time, to guarantee the integrity of the user data.

SUMMARY

Therefore, it would be beneficial to be able to store user data in a storage device in such a way that it would endure the reflow process. It would also be beneficial to store the user data in MBC cells after the reflow process is completed and the storage device is embedded in a host device. Various embodiments are designed to implement such endurance, examples of which are provided herein.

To address the foregoing, programmer's data which is transferred from a programming device to a storage device is initially stored in a memory device of the storage device by using a durable data-retention storage scheme. After the storage device is embedded in a host device, the programmer's data is read from the memory device internally and rewritten into the memory device by using a conventional storage scheme. The durable data-retention storage scheme is referred to hereinafter as the "first storage setup", and the conventional storage scheme is referred to hereinafter as the "second storage setup". (Note: the programmer's data is also referred to herein as the "user data".)

Using the first storage setup may include temporarily (i.e., before the storage device is embedded in a host) operating memory cells of the memory device as conventional SBC cells, or temporarily operating memory cells of the memory device as unconventional MBC cells. After the storage device is embedded in a host device the programmer's data is completely read from the memory device, by performing one or more read operations, or only one or more selected parts of the programmer's data are read from the memory device, by using the first storage setup, and the read programmer's data, or the one or more selected parts thereof are rewritten into the memory device by using the second storage setup.

BRIEF DESCRIPTION OF THE DRAWINGS

Various exemplary embodiments are illustrated in the accompanying figures with the intent that these examples not be restrictive. It will be appreciated that for simplicity and clarity of the illustration, elements shown in the figures referenced below are not necessarily drawn to scale. Also, where considered appropriate, reference numerals may be repeated among the figures to indicate like, corresponding or analogous elements. Of the accompanying figures.

DETAILED DESCRIPTION

The description that follows provides various details of exemplary embodiments. However, this description is not intended to limit the scope of the claims but instead to explain various principles of the invention and the manner of practicing it.

One solution to the problem posed by the reflow-induced heat involves permanently preloading the user data to an SBC storage component or to an SBC partition within a storage device. This solution may be acceptable by end users (i.e., the users using the host device, whether it is a digital camera, a cellular phone, etc.) but it is problematic from the host devices manufacturers' point of view because they need to separately handle (assemble, test, operate, etc.) several storage devices or storage partitions. In addition, dedicating an SBC storage device or, if SBC partition is used, a permanent SBC storage region for storing user data consumes real-estate in the host device, and managing an MBC storage device and an SBC device or SBC region/partition separately is inefficient.

Another solution involves storing the user data in MBC cells and performing a process known in the field of flash memory devices as a "healing process". During the healing process, the heat-induced discharge of the electric charge of a memory cell is mitigated by controlling the reflow temperature profile. However, the healing efficiency depends on the specifics of the healing process and on the involved packaging technology.

The terms "conventional location of a threshold voltage distribution curve on a threshold voltage axis", "conventional threshold voltage (distribution) range", "conventional threshold voltage distribution curve", and "conventional read reference voltage", refer to data storage instances that are commonly accepted by the flash memory industry as optimized for operating flash memory cells. "Operating a (flash) memory cell" means performing various storage and storage-related operations on the (flash) memory cell, such as writing data into and reading data from the (flash) memory cell. With respect to the "cells count vs. cells' threshold voltage levels" graph (which is shown, as an example, in FIG. 3A), the conventional level of the memory cells' threshold voltages (i.e., the locations of the memory cells' threshold voltages on the voltage axis on the voltage axis of the graph) depends on the type of storage device (e.g., 2 bit-per-cell based device, 3 bit-per-cell based device, etc.), the involved technology (e.g., NAND, NOR), and the specifics of the related storage process. That is, the locations of the conventional threshold voltage distribution curves and their related conventional threshold voltage ranges are predetermined such that data writing and data reading are optimized in terms of reliability and performance. Accordingly, the locations of the conventional threshold voltage distribution curve, and their related conventional threshold voltage ranges, pertaining to one type of storage device (e.g., 2 bit-per-cell based device) may differ from the locations of the conventional threshold voltage distribution curves, and their related conventional threshold voltage ranges, pertaining to another type of storage device (i.e., 3 bit-per-cell based device).

Flash memory cells, which are the storage elements of a storage device, are typically implemented as floating gate transistors. The floating gate of a memory cell is capable of retaining a maximum amount of electric charge that is limited by the physical dimensions of the floating gate. Different amounts of electric charge of a memory cell are interpreted as different binary states, where a binary state of a memory cell corresponds to the data stored in it (e.g., "00", "01", etc.). The electric charge of a memory cell, and therefore its binary state and data, is detectable by detecting the threshold voltage of the memory cell. Saying that a memory cell is, for example, in binary state "0" (in which case the cell stores one data bit), in binary state "11" (in which case the cell stores two data bits), or in binary state "101" (in which case the cell stores three data bits) and saying that the memory cell respectively stores the (exemplary) binary data "0", "11", or "101" are deemed equivalent. The number of bits of data (e.g., 1, 2, 3, etc.) a memory cell stores depends on the storage scheme used to operate the memory cell.

"Reflow soldering" (or "reflow", for short) is a soldering process in which the circuit board assembly is heated in order to solder the components' electric terminals to the corresponding pads on the circuit board. While the storage device is soldered to the host's circuit board, the high soldering temperature, which is typically within the range of 175 to 270, causes memory cells to lose electric charge. When a memory cell loses a significant amount of electric charge, a threshold voltage of the cell may change and, as a result, the binary state of the cell may change, thus altering the data stored in the cell. Such data change is of course undesired.

Figure 1:
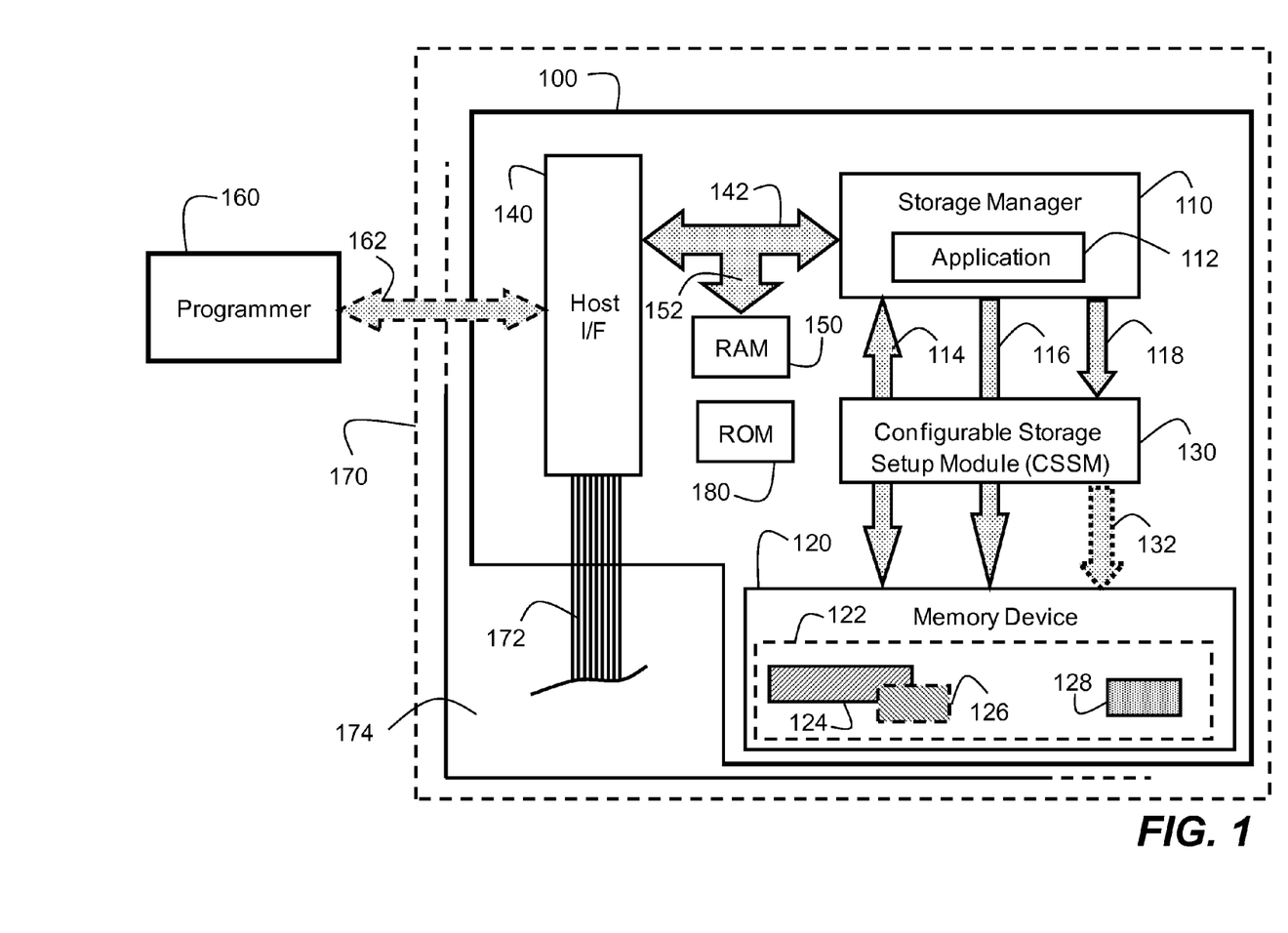
FIG. 1 is a block diagram of a storage device according to an example embodiment.

FIG. 1 is a block diagram of a storage device 100 according to an example embodiment. Storage device 100 includes a storage manager 110; a memory device 120 that includes a plurality of charge-storing memory cells 122 that may be, for example, NAND flash memory cells. Each of memory cells 122 holds K bits of data (i.e., K data bits) and is programmable into one of binary states, and each of the binary states is represented by a particular one of threshold voltage ranges and readable by using −1 read reference voltages. Storage device 100 also includes a Configurable Storage Setup Module ("CSSM") 130 that is configurable by storage manager 110 in a manner to enable storage device 100 to write data to and to read data from memory cells of memory cells 122 according to one or both of a first storage setup and a second storage setup, as described below. Storage device 100 also includes a host interface (i.e., host I/F 140) to facilitate bi-directional communication between storage manager 110 and a programming device or host device.

By way of example, storage device 100 is shown embedded into, and connected via control and data bus 172 to, a host 170. For technical and other reasons, before storage device 100 is embedded into host 170, storage device 100 is datawise initialized by its manufacturer by preloading the pertinent data into memory device 120. Although storage device 100 is shown in FIG. 1 connected to a programmer 160 (an exemplary programming device) and embedded in host 170, in reality this is not the case. Namely, before storage device 100 is embedded in host 170, storage device 100 is connected first to programmer 160 in order to preload the initial data to memory device 120 via command and data bus 162. (The initial data transferred from programmer 160 to storage device is also referred to hereinafter as "programmer's data".) The programmer's data preloaded to memory device 120 by programmer 160 may be or include, for example, GPS maps, music files, video files, games' files, and other types of data. In other words, although both programmer 160 and host 170 are shown connected to Host I/F 140, each device is connected to it at a different time: programmer 160 is connected to it in order to preload the programmer's data to memory device 120, and host 170 is connected to it physically when host 170 is assembled, and also operationally when host 170 is electrically switched "on". Command and data bus 162 has a connector that is removably connectable to a programming socket of storage device 100. The storage device's programming socket and the connector of command and data bus 162 are not shown in FIG. 1.

During programming of storage device 100 by programmer 160, the connector of command and data bus 162 is connected to the storage device's programming socket, and during assembly of host 170, control and data bus 172 is wired to host I/F 140. Control and data bus 172 may be a flat cable or circuit board conductors. During the assembly of host 170 by the host's manufacturer or assembler, storage device 100 is soldered to a circuit board 174 of host 170. After the assembly process of host 170 is completed and host 170 is powered up, storage device 100 and host 170 can interact in a conventional way.

Storage manager 110 is coupled 142 to Host I/F 140 and exchanges there through data/information, status information, and commands with external devices such as programmer 160 and host 170. Storage manager 110 also manages storage operations that include, or that are associated with, writing data into and reading and erasing data from memory device 120. CSSM 130 is operatively coupled 132 to memory device 120, and storage manager 110 manages the way data is written into and read from memory cells 122 by controlling the operation of CSSM 130, as explained below in more detail, for example in connection with FIG. 2.

Storage manager 110 transfers data to or receives data from memory device 120 over data bus 114; transfers addresses of memory cells to memory device 120 via address bus 116, and transfers control signals to CSSM 130 via control bus 118 to facilitate the data writing, data reading, and data erasing according to one or both of a first storage setup and a second storage setup. For example, if storage manager 110 is requested; e.g., by programmer 160 or by host 170, to write data into particular memory cells within memory device 120, storage manager 110 forwards the data to memory device 120 with the pertinent address of the particular memory cells and with control signals that facilitate writing the data into the correct memory cells. Likewise, if storage manager 110 is requested to read data from particular memory cells within memory device 120, Storage manager 110 forwards an address of the particular memory cells to memory device 120 with control signals that facilitate reading the data from the correct memory cells.

CSSM 130 is configurable by storage manager 110 in a sense that storage manager 110 can configure and use it to operate (i.e., write data into, read data from, and erase data from) memory cells within memory device 120 by using the first storage setup or the second storage setup. By "storage setup" is meant herein a configuration of CSSM 130 that enables storage manager 110 to operate memory device 120, or a selected part thereof (e.g., cells' group 124), by using, for example, a particular data density (i.e., SBC or MBC), or, assuming the data density is given (e.g., MBC), using the given data density unconventionally in order to improve data retention relative to the conventional use thereof "Data density" refers to the number of bits (K) a memory cell stores: the larger K is, the denser is the data stored in the memory cell. K depends on the specifics of the storage setup. For example, using the first storage setup may include operating memory cells of memory cells 122, for example, as 1 bit-per-cell cells, and using the second storage setup may include operating memory cells of memory cells 122, for example, as 2 bit-per-cell cells. Using the first storage setup and the second storage setup may involve using the same data density (i.e., the same number of bits per cell), or different data densities (i.e., different number of bits per cell). For example, the first storage setup may enable storage manager 110 to manage memory cells 122 as SBC cells (i.e., as 1 bit-per-cell cells) in order to provide durable data retention, and the second storage setup may enable storage manager 110 to manage memory cells 122 as MBC cells in order to store data more compactly.

The term "storage setup" also pertains to, or is defined by, a set of changeable threshold voltage distributions and read reference voltages that are selected to obtain specific reliability or performance (e.g., improved data retention durability, more compacted data). The set of threshold voltage distributions and read reference voltages is changeable, which means that the number of threshold voltage distributions and the number of read reference voltages can change in accordance with the storage setup to be used. If the number of threshold voltage distributions and the number of read reference voltages are changed, the locations of the new threshold voltage distributions and read reference voltages on the voltage axis also change in order to easily distinguish between the different threshold voltage distributions. However, according to the present disclosure, the locations of the threshold voltage distributions and read reference voltages may change without changing the number of threshold voltage distributions or read reference voltages.

After storage device 100 is manufactured, programmer's data is preloaded into memory device 120 before storage device 100 is embedded in host 170, which may be, for example, a cellular phone or a digital camera. The programmer's data is preloaded into memory device 120 before the assembly phase takes place because preloading data to a storage device and executing various testing procedures to test the storage device after the storage device is embedded in the host requires significant changes in traditional host's manufacturing lines/processes, and such changes are costly. Therefore, after the programmer's data is preloaded to memory device 120, the testing is performed by programmer 160 before storage device 100 is embedded in the host device (e.g., host 170).

After the data preloading process is completed, storage device 100 is embedded in host 170 by using a reflow process or a process similar to the reflow process. After storage device 100 is embedded in host 170, host 170 and storage device 100 are usually subjected to normal ambient temperatures. However, during the reflow process, storage device 100 is subjected to temperatures that are by far higher than the normal ambient temperature. As explained herein, the high soldering temperature results in degradation in data retention and, therefore, in data loss. Therefore, in order to ensure the integrity of the programmer's data stored in memory cells 122 throughout the reflow soldering process, the data that programmer 160 transfers to storage device 100 is initially (i.e., before the storage card is embedded in the host) written into memory cells 122 by using a first storage setup that provides, facilitates, or supports durable data retention. Then, after storage device 100 is embedded in host 170, and assuming that storage device 100 is powered up by host 170, the programmer's data, or one or more selected parts thereof, stored in memory cells 122 is/are rewritten into memory cells 122 by using a second storage setup. The second storage setup provides normal data retention. (Note: using normal data retention after the storage device is embedded in the host is satisfactory because, after the host assembly process is completed, the storage device is subjected to normal operating and ambient conditions.) Before the programmer's data, or the selected parts thereof, is/are rewritten into memory cells 122 by using the second storage setup, the programmer's data or the one or more selected parts thereof is/are read from memory cells 122 by using the first storage setup.

The question whether all or selected parts of the programmer's data is/are (to be) read from and thereafter rewritten into memory cells 122, and how many read/write operations are required, depends on the data-wise damage caused by/during the reflow process, and on how susceptible the memory cells, which hold that data, are to data read failures. In general, the programmer's data can be read from, and thereafter rewritten into memory cells 122, completely or partly. More specifically, there are three options for reading and rewriting programmer's data from/into memory cells 122: (1) the programmer's data can be read and rewritten from/into memory cells 122 in its entirety by using one read operation and one write operation, or (2) the programmer's data can be read and rewritten from/into memory cells 122 in its entirety by using multiple read operations (i.e., reading the entire programmer's data one part at a time) and as many write operations, or (3) only selected parts of the programmer's data may be read from and thereafter rewritten into memory cells 122. Option (2) is beneficial in cases where the storage manager is busy doing other things and it may read/rewrite parts of the programmer's data as background operations. Option (3) is beneficial in cases where the reflow process does not severely affect some of the memory cells within memory cells 122 that initially store the programmer's data. In such cases, reading and rewriting only the data parts that are stored in severely affected memory cells may suffice. In other words, there is no need to read and rewrite data parts that are stored in negligibly affected memory cells. If particular memory cells within memory cells 122 are known in advance (e.g., empirically) to be storage-wise problematic, for example because they are severely susceptible to the reflow process, only part(s) of the programmer's data that is/are stored in the problematic memory cells may be read and thereafter rewritten in memory cells 122. Therefore, the memory cells from which part(s) of the programmer's data is/are (to be) read may be predetermined (i.e., selected in advance) based on the cells' susceptibility to failures.

Figure 3A:
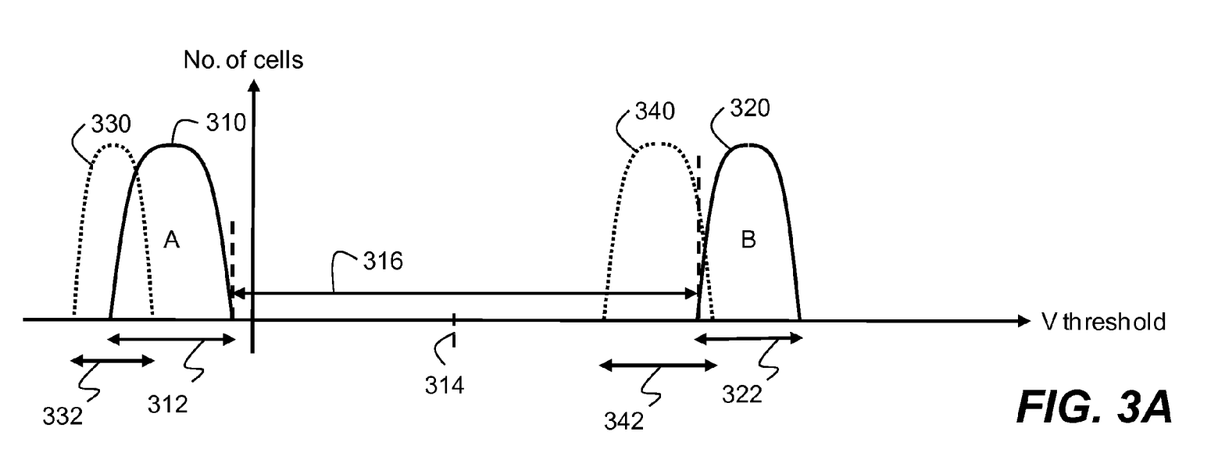
FIG. 3A is a first storage setup according to an example embodiment.
Figure 3B:
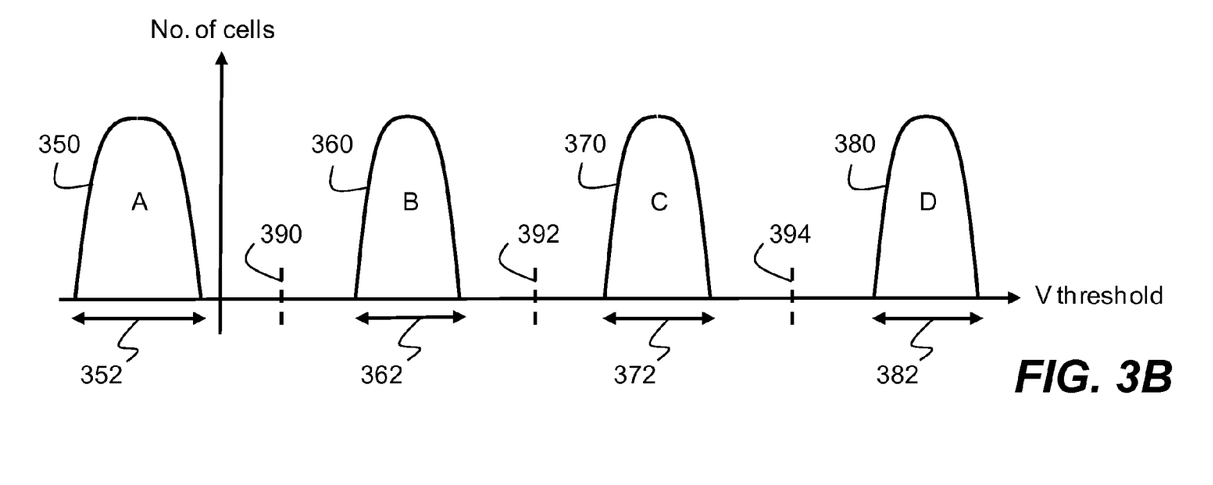
FIG. 3B is a second storage setup according to an example embodiment.
Figure 4A:
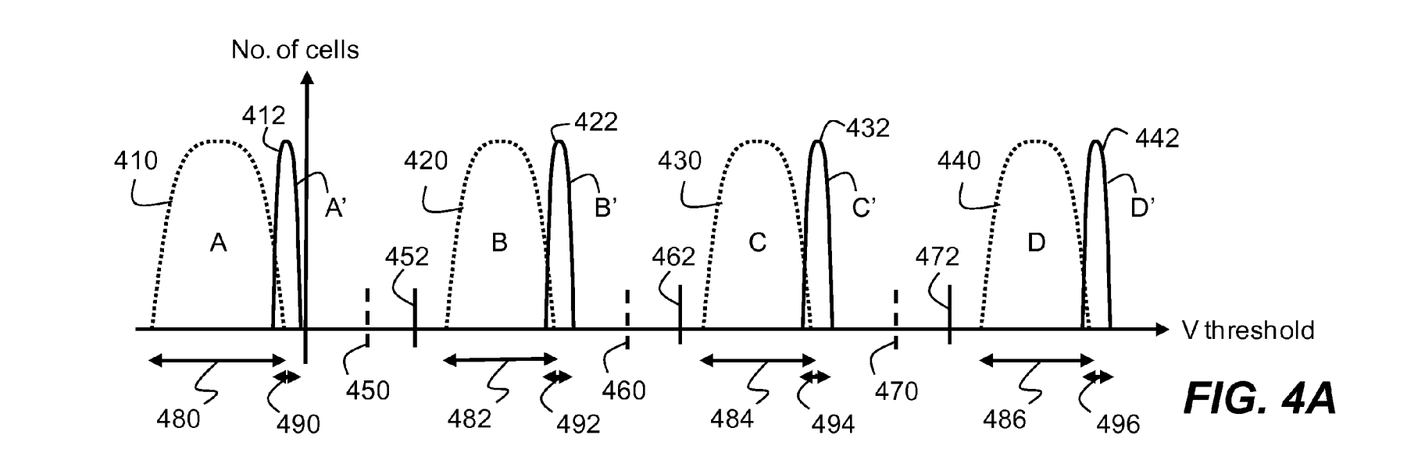
FIG. 4A is a first storage setup according to another example embodiment.
Figure 4B:
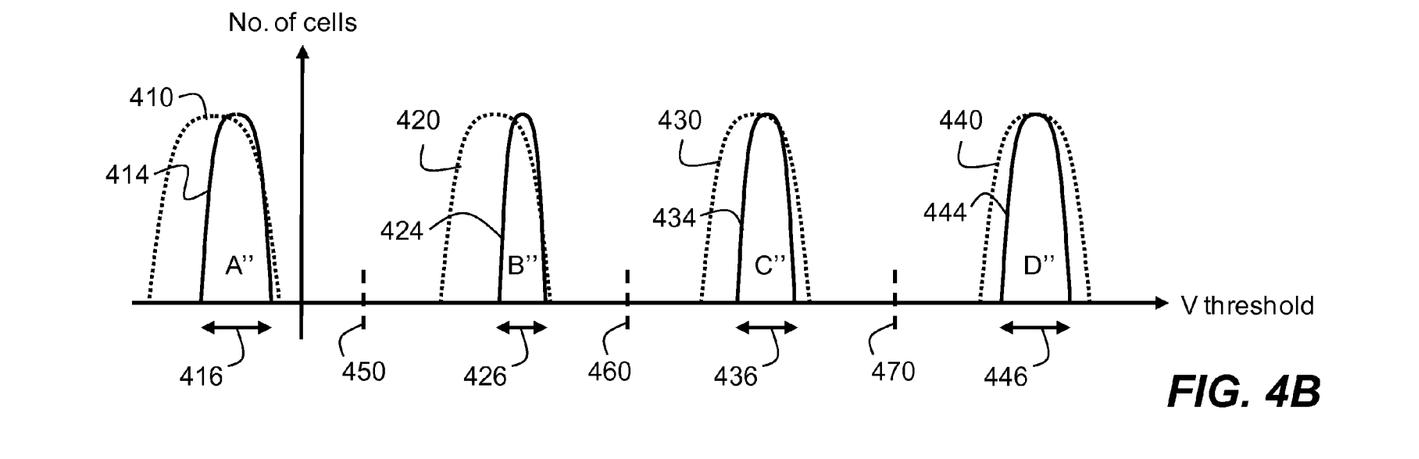
FIG. 4B is a second storage setup according to another example embodiment.

The first storage setup and the second storage setup may respectively be devised in a manner to operate memory cells of memory device 120 as SBC cells, to provide durable data retention, and as MBC cells to store the same data more compactly in memory device 120, as shown in FIGS. 3A and 3B, which are described below. Alternatively, the first storage setup and the second storage setup may both be devised in a manner to operate memory cells of memory device 120 as MBC cells. However, if both storage setups are devised to operate the memory cells as MBC cells, using the first storage setup involves using unconventional threshold voltage distribution curves and (optionally) unconventional read reference voltages, as shown in FIGS. 4A and 4B, which are described below.

The first storage setup used to preload the programmer's data (i.e., the data transferred from programmer 160) to storage device 100 may be the SBC storage setup. As explained above, memory cells retain their electric charge, and therefore their threshold voltage levels and binary states, in a better way if they are operated as SBC cells rather than MBC cells. Accordingly, storage manager 110 configures CSSM 130 in a way to selectively operate a first group of memory cells 122 (e.g., group 124) as SBC cells. Then, storage manager 110 temporarily writes the programmer's data into cells group 124 by using the SBC storage setup. Sometime after the programmer's data is initially written into cells group 124, storage device 100 is soldered to circuit board 174 of host 170.

After host 170 is assembled, switching it "on" powers up storage device 100. Shortly after storage device 100 is powered up by host 170, storage manager 110 reads the programmer's data from cells group 124. Because storage manager 110 temporarily writes the programmer's data into cells group 124 by using the SBC storage setup, storage manager 110 reads the programmer's data from cells group 124 by using the SBC storage setup. "Writing data into or reading data from a memory cell by using an xBC storage setup" means that data is written to or read from the memory cell by operating the memory cell as xBC cell ('x' can be 'S', for "Single", or 'M', for "Multi").

Using a second storage setup for reconditioning data includes using MBC storage setup. After storage manager 110 reads the programmer's data from cells group 124 it temporarily stores 152 it in a Random Access Memory ("RAM") 150. Thereafter, or concurrently, storage manager 110 reconfigures CSSM 130 in a manner to operate memory cells 122 according to the second storage setup. Because at this stage it is beneficial to store the programmer's data in memory cells 122 more compactly, the second storage setup involve operating memory cells 122 as MBC cells; e.g., as 2 bit-per-cell cells (i.e., K=2), or as 3 bit-per-cell cells (i.e., K=3), etc. (i.e., K>3). Then, storage manager 110 reads 152 the data from RAM 150 and compactly rewrites it into a second group of memory cells 122 (e.g., group 126 or group 128), this time by using the second storage setup which is the MBC storage setup. Changing the storage setup does not necessarily mean that all of the user data has to be rewriting into the second group of memory cells. That is, a storage setup may be changed only to change the way the data or part thereof is read from memory cells of the first group of memory cells, or to handle only data areas/"regions" within the first group of memory cells which are susceptible to data errors or to operation failure. In other words, only data that is stored in seemingly susceptible memory cells of the first group may be rewritten into the second group of memory cells.

The first group of memory cells and the second group of memory cells may be separate groups, as demonstrated by separate groups 124 and 128. Alternatively, the first group of memory cells and the second group of memory cells may have one or more memory cells in common, as demonstrated by the partial overlapping of groups 124 and 126. The second group of memory cells (e.g., group 126 or group 128) is shown in FIG. 1 smaller than group 124 (i.e., each of group 126 and group 128 includes fewer memory cells than group 124) because the same amount of data (i.e., the programmer's data) is rewritten into the second group of memory cells more compactly (i.e., each memory cell of the second group holds more data bits than are stored by each memory cell of the first group).

Using the first storage setup may include preloading data by using the MBC storage setup in unconventional way, and reconditioning the data by using the MBC storage setup in a conventional way, as described below. The first storage setup may be devised in a manner to write the programmer's data into memory cells 122 by using the MBC storage scheme. Using the MBC storage scheme conventionally is problematic because the soldering heat decreases the threshold voltage of the memory cells and this causes data to be unintentionally changed, as explained above. Therefore, if the MBC storage scheme is used as the first storage setup, it is used in an unconventional way, as explained below.

As explained above, excess heat accelerates loss of electric charge in memory cells and, therefore, causes the pertinent threshold voltage levels to be decreases (i.e., shifted leftward on a voltage axis of the threshold voltage distribution graph). However, by initially shifting the threshold voltage distributions of memory cells rightward (hence the unconventional use of threshold voltage distributions), the effect of the soldering heat can largely be compensated for.

The extent to which the threshold voltage distributions of the memory cells is to be initially shifted to the right relative to their conventional locations can be determined, for example empirically, such that the adversary effect of the high soldering temperature on memory cells 122 would be compensated for by the initial right shift. That is, it is expected that the high soldering temperature would shift the threshold voltage distributions of memory cells 122 "back" to their conventional locations on the threshold voltage axis, or at least sufficiently close to the these locations. By "sufficiently close to the conventional locations" is meant that the programmer's data can initially be written into, and later read from, memory cells 122 with negligible degradation in reliability and performance by using the shifted threshold voltage distributions even though the locations and shapes of the shifted threshold voltage distributions deviate from the locations and shapes of the conventional threshold voltage distributions.

Regardless of which type of first storage setup is used (i.e., conventional SBC or unconventional MBC), storage manager 110 uses it to initially write the programmer's data into memory cells 122 if it "knows", such as by sensing or inferring, or by being notified by programmer 160, that storage device 100 is connected to programmer 160. Likewise, storage manager 110 uses the first storage setup to read the programmer's data and the second storage setup to rewrite the programmer's data into memory cells 122 if it "knows", such as by sensing or inferring, or by being notified by host 170, that storage device 100 is connected to host 170. Various example ways that enable storage manager 110 to determine if it is connected to programmer 160 or to host 170 are described below. Storage manager 110 may execute an application 112 in order to perform the various configurations of CSSM 130, steps, operations, determinations, etc. that are described herein.

Figure 2:
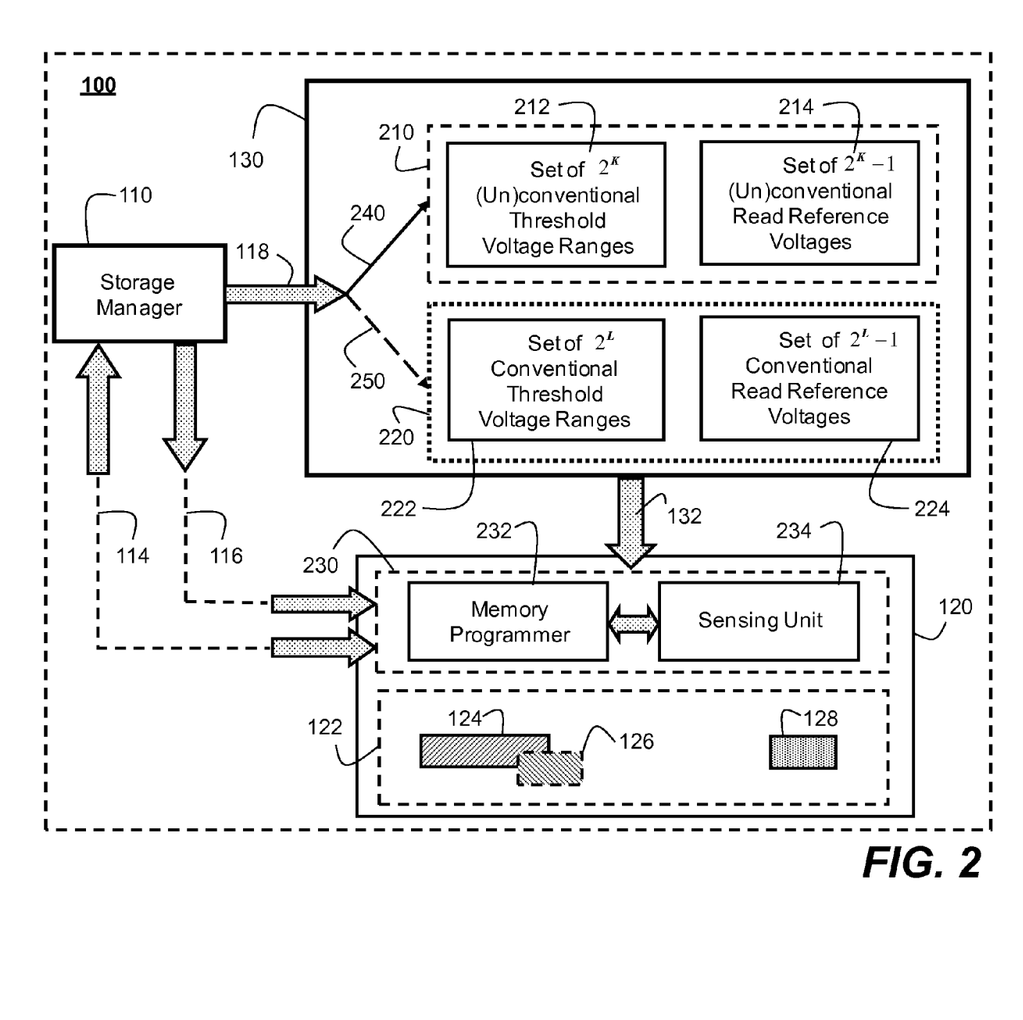
FIG. 2 shows the storage device of FIG. 1 in more details.

FIG. 2 is a block diagram of a configurable storage setup module ("CSSM") 130 according to an example embodiment. FIG. 2 will be described in association with FIG. 1. As stated above, CSSM 130 is operatively connected to memory device 120 and storage manager 110 manages memory device 120 by controlling the operation of CSSM 130. CSSM 130 is configured by storage manager 110, and thereafter used by storage manager 110, to selectively operate (i.e., write data into, read or erase data from) memory cells within memory cells 122 by using the first storage setup or the second storage setup.

Selecting a suitable set of threshold voltage distributions and read reference voltages by storage manager 110 enables storage manager 110 to operate memory cells 122 in a first way to ensure that the memory cells still retain the programmer's data after storage device 100 is embedded in host 170, or in a second way to ensure that if the programmer's data is corrupted by the soldering process, it can be restored. Retaining the programmer's data may be facilitated by using low data density, and after storage device 100 is embedded in host 170, a higher data density is used to store the data compactly. Restoration of data is facilitated by voltage-wise shifting at least some of the read reference voltages leftward sufficiently to enable storage manager 110 to correctly interpret the cells' threshold voltage levels that were shifted leftward as a result of the reflow process.

CSSM 130 contains configuration information that is required to implement the first storage setup and the second storage setup. For convenience, the information required to implement the two storage setups is functionally divided into two parts: the information pertaining to the first storage setup is shown at 210, and the information pertaining to the second storage setup is shown at 220. If storage manager 110 determines that the first storage setup should be used, it sends 118 a command to CSSM 130 to select 240 information 210. If storage manager 110 determines that the second storage setup should be used, it sends 118 a command to CSSM 130 to select 250 information 220.

Information 210 includes information 212 that pertains to a set of conventional threshold voltage ranges/distributions or, depending on the type of first storage setup that is actually used, unconventional threshold voltage ranges/distributions. Information 210 also includes information 214 that pertains to a set of conventional read reference voltages or, depending on the type of used first storage setup, unconventional read reference voltages. Information 212 and information 214 define the first storage setup. For example, K=1 (i.e., memory cells are (to be) operated as 1 bit-per-cell cells) means that each of the memory cells of memory cells 122 (to be) operated as 1 bit-per-cell cell can be in one of two ( ) binary states (i.e., "0" or "1") at a time. Therefore (continuing the example), information 212 pertains to two threshold voltage ranges/distributions: one threshold voltage range/distribution that represents one of the two related binary states, and another threshold voltage range/distribution that represents the other of the two binary states.

Likewise, information 220 includes information 222 that pertains to a set of ranges of conventional threshold voltage levels and information 224 that pertains to a set of conventional read reference voltages. Information 222 and information 224 define the second storage setup. For example, L=2 (i.e., memory cells within memory cells 122 are (to be) operated as 2 bit-per-cell cells), means that each of the memory cells (to be) operated as 2 bit-per-cell cell can be in one of four ( ) binary states (i.e., "00", "01", "10", or "11") at a time. Therefore (continuing the latter example), information 222 pertains to four threshold voltage ranges/distributions, where each of the four threshold voltage ranges/distributions represents a particular one of the related four binary states.

Whenever storage manager 110 writes data into or reads data from memory cells 122, it determines which storage setup is relevant to the specific data writing and to the specific data reading and, based on the determination result, instructs 118 CSSM 130 to select the information pertaining to the relevant storage setup. If storage manager 110 determines that the first storage setup is the relevant storage setup, it instructs 118 CSSM 130 to select information 210 (the selection of information 210 is shown at 240). If, however, storage manager 110 determines that the second storage setup is the relevant storage setup, it instructs 118 CSSM 130 to select information 220 (the selection of information 220 is shown at 250). By way of example, storage manager 110 is shown selecting 240 the first storage setup and deselecting 250 the second storage setup. Saying that CSSM 130 is using information 210 (or information 220) to operate memory cells and saying that CSSM 130 is configured to operate these cells according to the first storage setup (or, if information 220 is selected, according to the second storage setup) are deemed equivalent.

Memory device 120 includes a programming unit 230. Programming unit 230 is responsible for the actual programming of memory cells 122 (i.e., writing data to the cells), and reading and erasing data from memory cells 122. Programming unit 230 includes a memory programmer 232 and a sensing unit 234. In order to write a data into memory cells 122, storage manager 110 transfers the data to programming unit 230 with an address of the memory cells into which the data should be written. In order to enable programming unit 230 to write the data in memory cells 122 by using the correct storage setup, storage manager 110 transfers 118 a storage setup selection command to CSSM 130 to employ the correct information. The storage setup selection command indicates to CSSM 130 which information (i.e., information 210 or information 220) should be used to write the data. Programming unit 230, then, receives 132 the selected information (e.g., information 210) from CSSM 130 and uses it accordingly.

Assume that the information transferred 132 from CSSM 130 to programming unit 230 is information 210. Storage manager 110 uses memory programmer 232 to write the data into memory cells of memory cells 122 by using the first storage setup. That is, after programming unit 230 receives (i) the data to be written in memory cells 122 (e.g., programmer's data), (ii) the pertinent address, and (iii) the pertinent storage setup information (in this example information 210), storage manager 110 uses memory programmer 232 to stepwise program the pertinent memory cells (e.g., cells' group 124) while, during each programming step, memory programmer 232 increases the threshold voltage levels of the memory cells. After each programming step, storage manager 110 uses sensing unit 234 to detect the current binary states of the programmed memory cells by using the set of threshold voltage ranges/distributions and read reference voltages specified in, or defined by, information 210. Then, storage manager 110 uses sensing unit 234 to determine whether the current binary states of the programmed memory cells have reached the target binary states. (A "target" binary state of a memory cell is the bitwise portion "x", "xy", "xyz", etc. (where each of "x", "y" and "z" is a binary value "0" or "1") of the data that is to be stored in it). If a current binary state of a memory cell differs from its target binary state, the memory cell undergoes an additional programming step. The process of increasing the threshold voltage levels of the memory cells and comparing the consequent binary states to the respective target binary states is reiterated until each of the programmed memory cells reaches its target binary state, i.e., until each programmed memory cell stores the bitwise portion of the data that is intended to be stored in it.

Storage manager 110 also uses sensing unit 234 to read data from memory cells 122. In order to read data from a memory cell, sensing unit 234 gradually increases the level of a voltage that is applied to the floating gate of the cell until electrical current starts to flow through the cell. The minimal voltage level at which electrical current starts to flow through a memory cell is the threshold voltage of the memory cell and, as explained above, the threshold voltage of a memory cell indicates the binary state of the cell. Storage manager 110, therefore, uses sensing unit 234 to detect the threshold voltage levels of the memory cells. Then, storage manager 110 compares the cell's threshold voltage levels to the set of read reference voltages specified in, or defined by, information 210 in order to determine the binary states of the memory cells.

When storage device 100 is connected to programmer 160 storage manager 110 uses CSSM 130 and programming unit 230 to write the programmer's data into memory cells within memory cells 122 according to the first storage setup. After storage device 100 is embedded in host 170, storage manager 110 uses CSSM 130 and programming unit 230 to rewrite the programmer's data in memory cells of memory cells 122 according to the second storage setup. FIG. 3A and FIG. 4A, which are described below, demonstrate alternative first storage setups. FIG. 3B and FIG. 4B, which are also described below, demonstrate alternative second storage setups.

Programmer 160 may include a storage device interface for interfacing with storage device 100, and a controller for communicating with storage manager 110 via the storage device interface. The storage device interface and the controller of programmer 160 are not shown in FIGS. 1 and 2. The controller of programmer 160 may send an instruction to storage manager 110 to configure CSSM 130 to operate a first group of memory cells 122 according to a first storage setup, and to transfer the programmer's data to storage manager 110 via the storage device interface in order for storage manager 110 to write it in the first group of memory cells 122 by using the first storage setup.

Host 170 may include a storage device interface for interfacing with storage device 100, and a controller for communicating with storage manager 110 via the storage device interface. The storage device interface and the controller of host 170 are not shown in FIGS. 1 and 2. The controller of host 170 may cause storage manager 110 to read the programmer's data as a whole or in parts, or only selected parts of the programmer's data, from the first group of memory cells 122 according to the first storage setup; to configure CSSM 130 to operate memory cells 122 according to the second storage setup; and to write the programmer's data as a whole or in parts, or only selected parts of the programmer's data, into a second group of memory cells 122 by using the second storage setup.

FIG. 3A shows an SBC storage scheme (i.e., K=1) as an exemplary first storage setup for preloading programmer's data to a storage device before the storage device is embedded in a host. FIG. 3A will be described in association with FIG. 1 and FIG. 2. As known in the art of flash memory devices, a threshold voltage of a memory cell is directly correlated to the amount of electric charge held by a floating gate of the memory cell, and the binary state of the cell (i.e., the data stored in the cell) is detected by comparing the cell's threshold voltage to one or more read reference voltages. Turning to FIG. 3A, using the SBC storage scheme means, inter alia, that each memory cell that is operated as SBC cell can be in one of two binary states at a time; i.e., in binary state "A", which is represented by conventional threshold voltage distribution curve 310, or in binary state "B", which is represented by conventional threshold voltage distribution curve 320. In general, a physical binary state represents (i.e., it is interpreted as) a specific binary value that depends on the used convention. For example (turning to FIG. 3A), physical binary states "A" and "B" may respectively represent binary values "1" and "0". In general, binary states are represented by threshold voltage distribution curves/ranges, and a memory cell is said to be in a particular binary state if the threshold voltage of the cell resides within the threshold voltage distribution range corresponding to that binary state. For example, a memory cell is in binary state "A" if its threshold voltage reside within a threshold voltage distribution range 312, and in binary state "B" if its threshold voltage reside within a threshold voltage distribution range 322. Because, according FIG. 3A, there are two ( ) binary states (i.e., binary states "A" and "B"), they are detectable by using one ( ) read reference voltage (i.e., read reference voltage 314). Due to the relatively wide voltage error margin 316 that exists between the two binary states, the SBC storage scheme features durable data retention even under abnormal conditions such as an excess heat generated, for example, during the reflow process. Therefore, the SBC storage setup may be used as the first storage setup to write a programmer's data into memory cells 122 before storage device 100 is embedded in Host 170. Threshold voltage distribution ranges 312 and 322 are regarded as "conventional threshold voltage ranges" of the SBC storage scheme. In general, the number N of threshold voltage distribution curves, and their related ranges, depends on K (i.e.,).

Assume that embedding storage device 100 in Host 170 includes a reflow soldering phase during which storage device 100 is soldered to circuit board 174. As a result of the excess heat generated by/during the reflow process, the memory cells holding the programmer's data (e.g., cells group 124) lose electric charge at an increased rate relative to the electric charge losing rate under normal conditions. The lose of electric charge results in a decrease in the threshold voltage level of the pertinent cells, which is demonstrated in FIG. 3A as a shift of the threshold voltage ranges 312 and 322 to the left on the threshold voltage axis. In general, the higher the soldering temperature and the longer the exposure of a memory cell to the soldering temperature, the greater the shift of its threshold voltage to the left. By way of example, the threshold voltage distribution curves 310 and 320 are shifted leftward to unconventional locations. The threshold voltage distribution curves 310 and 320 are respectively shown, after the shift, at 330 and 340. The threshold voltage distribution ranges 312 and 322 are likewise shifted leftward to unconventional locations. The distribution ranges 312 and 322 are shown, after the shift, at 332 and 342. (Note: if all the memory cells that are in binary state "A" do not initially store any electrical charge, threshold voltage distribution curve 310 remains at the same position because a threshold voltage of a cell can shift leftward if the cell loses electrical charge.)

As explained above, the SBC storage scheme can be used as the first storage setup to preload the data to the storage device because this type of storage scheme has a relatively wide "state A"-to-"state B" margin (i.e., error margin 316) that accommodates for the detrimental effect of the reflow process. That is, the wide error margin between conventional read reference voltage 314 and the conventional location of threshold voltage distribution range 322 can accommodate a relatively large shift of the threshold voltage distribution range to the left. However, storing a large amount of programmer's data by using the SBC storage scheme is uneconomical in terms of storage space. Therefore, in order to free storage space, it is beneficial to rewrite the programmer's data into memory cells 122 compactly.

Before the programmer's data can be rewritten into the storage device compactly, it has to be read from the pertinent memory cells. As explained above, the data in question is preloaded to the storage device using the SBC storage scheme. Therefore, reading that data is also performed by using the SBC storage scheme. Threshold voltage distribution curves 330 and 340, which respectively represent the shifted threshold voltage distribution curves 310 and 320, are still (i.e., after the reflow process is completed) easily detectable because all the memory cells whose threshold voltage originally lies on the conventional threshold voltage distribution curve 320 have, after the reflow process is completed, a threshold voltage that is still noticeably higher than conventional read reference voltage 314. In other words, no threshold voltage of a memory cell in binary state "B" has neared conventional read reference voltage 314 as a result of the reflow process. This means that conventional read reference voltage 314 can still be used as is (i.e., without adjustment, or conventionally) to read the data from the memory cells.

In order to use the SBC storage scheme as the first storage setup, first information 210 defines, or includes information pertaining to, a set of two ( ) conventional threshold voltage distribution ranges (e.g., threshold voltage distribution ranges 312 and 322) and to one conventional read reference voltage (e.g., conventional read reference voltage 314). Before storage device 100 is embedded in host 170, programming unit 230 uses information 210 (i) to program, or to refrain from programming, a first group of memory cells 122, for example group 124, in order for these cells to change state to, or to remain in, the binary state "A", and (ii) to program other memory cells of group 124 in order for them to be in the binary state "B"; that is, if the other memory cells should be at binary state "B". After the embedding process is completed, programming unit 230 uses information 210 to read the programmed data. Referring to the example shown in FIG. 3A, K=1, information 212 defines a set of two ( ), in this example conventional, threshold voltage distribution curves 310 and 320, and respective threshold voltage distribution ranges 312 and 322, and information 214 defines a set of one ( ) in this example conventional, read reference voltage 314.

FIG. 3B shows a 2 bit-per-cell storage scheme for use as an exemplary second storage setup scheme for rewriting programmer's data into the storage device. FIG. 3B will be described in association with FIG. 1 and FIG. 2. The storage scheme shown in FIG. 3B is an exemplary MBC storage scheme where L=2, but other MBC storage schemes may be used instead, in which L is greater than 2 (e.g., L=3, L=4, etc.).

After the storage device embedding process is completed, the programmer's data, which was preloaded to, and thereafter read from, memory cells group 124 by using the SBC storage scheme, can be safely rewritten into memory cells 122 compactly ('safely'—without exposing the storage device to the heat caused by the reflow process). Using the conventional MBC scheme of FIG. 3B, the programmer's data is rewritten into the storage device (e.g., to memory cells group 126, to memory cells group 128, or elsewhere in memory cells 122) by storing two data bits (K=2) in each of the pertinent memory cells. Storing two data bits in a memory cell means that the memory cell can be in one of four binary states: in binary state "A", which is represented by conventional threshold voltage distribution curve 350, in binary state "B", which is represented by conventional threshold voltage distribution curve 360, in binary state "C", which is represented by conventional threshold voltage distribution curve 370, or in binary state "D", which is represented by conventional threshold voltage distribution curve 380. Threshold voltage distribution curves 350, 360, 370, and 380 are regarded as "conventional threshold voltage curves" of the MBC storage scheme which, in this example, involves storing two bits in the memory cells operated as MBC cells. Binary state "A" may be interpreted as binary value "11", binary state "B" may be interpreted as binary value "01", etc. Detecting the binary state of a memory cell is performed by detecting the memory cell's threshold voltage level and comparing it to one or more read reference voltages, as explained above. Turning to FIG. 3B, there are three conventional read reference voltages, designated as 390, 392, and 394, because three read reference voltages are required to determine whether a memory cell is in one of the four binary states "A", "B", "C", or "D".

After storage manager 110 reads the programmer's data from cell's group 124 and before it rewrites it into memory cells 122 (e.g., into cells group 126 or 128), storage manager 110 temporarily stores the programmer's data in a temporary memory (e.g., RAM 150). Then, storage manager 110 may erase the memory cells currently operated as SBC cells (i.e., the cells initially holding the programmer's data; e.g., cells group 124) before they can be operated according to the MBC storage setup. After the programmer's data is erased from the SBC cells and rewritten into memory cells 122, this time by using the MBC storage setup, storage manager 110 erases the programmer's data from the temporary memory (i.e., RAM 150). Storage manager 110 may rewrite the programmer's data, this time as MBC-operated cells, into any group of free/erased cells in memory cells 122, for example in group 126 or in group 128. Each of groups 126 and 128 has half the storage area of group 124 because the programmer's data was initially written into group 124 by using the 1 bit-per-cell storage scheme, whereas the same data is rewritten into group 126, or into group 128, or elsewhere in memory cells 122, using the 2 bit-per-cell storage scheme.

As explained above, storage manager 110 can selectively operate memory cells 122 according to the SBC storage scheme (i.e., as SBC cells) or according to the MBC storage scheme (i.e., as MBC cells), and selecting a storage setup is done by storage manager 110 transferring 118 a selection command to CSSM 130, as described above in connection with information 210 and information 220. In general, after storage device 100 is embedded in host 170, storage device 100 is subjected to normal operating and ambient conditions. Therefore, data (including the programmer's data) can safely be managed (i.e., written, erased, read, etc.) by using conventional threshold voltage distribution curves 350, 360, 370, and 380, and conventional read reference voltages 390, 392, and 394. Referring to the example shown in FIG. 3B, L=2, information 222 defines a set of four ( ) conventional threshold voltage distribution ranges 352, 362, 372, and 382, and information 224 defines a set of three ( ) conventional read reference voltages 390, 392, and 394.

FIG. 4A and FIG. 4B show an exemplary case where MBC storage schemes are used both as the first storage setup and as the second storage setup. FIG. 4A and FIG. 4B refer to a private case where K=L=2. FIG. 4A shows an MBC storage scheme as an exemplary first storage setup scheme for preloading programmer's data into a storage device before the storage device is embedded in a host. FIG. 4A will be described in association with FIG. 1 and FIG. 2. Conventional threshold voltage distribution curves 410, 420, 430, and 440 respectively represent binary states "A", "B", "C", and "D". A memory cell is conventionally in binary state "A" if its threshold voltage resides within a conventional threshold voltage distribution range 480; in binary state "B" if its threshold voltage resides within a conventional threshold voltage distribution range 482; in binary state "C" if its threshold voltage resides within a conventional threshold voltage distribution range 484, and in binary state "D" if its threshold voltage resides within a conventional threshold voltage distribution range 486. A memory cell is unconventionally in binary state "A", "B", "C", or "D" if its threshold voltage resides outside the respective conventional threshold voltage distribution ranges, for example within unconventional threshold voltage distribution range 490, 492, 494, or 496.

The amount of electrical charge injected into the memory cells is controllable. By controlling the amount of electrical charge injected into a memory cell, storage manager 110 can, to a large extent, control the initial level of the cell's threshold voltage within a required threshold voltage distribution range, may it be conventional (e.g., threshold voltage range 480, 482, 484, or 488), or unconventional, as explained below. In other words, storage manager 110 can set the initial voltage-wise location and the initial shape (e.g., maximal voltage width, or narrowness) of a particular threshold voltage distribution curve as required.

The extent to which threshold voltage distribution curves, and their related ranges, are shifted (i.e., moved) leftward as a result of the reflow process can be estimated (at least roughly) empirically. Based on empirical estimations, the heat-induced leftward shift of the threshold voltage levels of the memory cells is compensated for, at least partly, by initially programming the memory cells in such a way that the respective threshold voltage distribution curves are elevated (i.e., moved rightward in FIG. 4A) relative to the conventional threshold voltage distribution curves.

Turning back to FIG. 4A, the capability of storage manager 110, to "relocate" threshold voltage distribution curves (i.e., to set a new location for these curves) and to reshape the threshold voltage distribution curves, is used to create and to use alternative (i.e., unconventional) threshold voltage distribution curves to safely preload the programmer's data into memory cells 122. The unconventional threshold voltage distribution curves associated with binary states "A", "B", "C", and "D" are respectively shown at 412, 422, 432 and 442.

Unconventional threshold voltage distribution curve 412 is an alternative to conventional threshold voltage distribution curve 410; unconventional threshold voltage distribution curve 422 is alternative to conventional threshold voltage distribution curve 420; unconventional threshold voltage distribution curve 432 is alternative to conventional threshold voltage distribution curve 430; and unconventional threshold voltage distribution curve 442 is alternative to conventional threshold voltage distribution curve 440. As shown in FIG. 4A, unconventional threshold voltage distribution curves 412, 422, 432, and 442 are noticeably voltage-wise narrower than conventional threshold voltage distribution curves 410, 420, 430, and 440, as threshold voltage range 490 is narrower than threshold voltage range 480; threshold voltage range 492 is narrower than threshold voltage range 482; threshold voltage range 494 is narrower than threshold voltage range 484; and threshold voltage range 496 is narrower than threshold voltage range 486.

Shifting and narrowing threshold voltage distribution curves, as exemplified herein, compensate for two effects of the reflow process: (1) decreasing the memory cells' threshold voltage levels (i.e., shifting their threshold voltage levels leftward), and (2) widening the threshold voltage distribution curves. Therefore, unconventional threshold voltage distribution curves 412, 422, 432, and 442, or similar threshold voltage distribution curves, can be used as the first storage setup to preload programmer's data to storage device 100 before storage device 100 is embedded in host 170. It is noted that using narrow threshold voltage distribution curves increases the error margin between each two adjacent threshold voltage distribution curves. That is, the narrower threshold voltage distribution curves are, the larger is the error margin between adjacent threshold voltage distribution curves, and the better is the data retention capability of the pertinent memory cells. After the programmer's data is preloaded to memory cells 122 by using unconventional threshold voltage distribution curves 412, 422, 432, and 442 and storage device 100 is embedded in a host, the programmer's data has to be read first and then rewritten into memory cells 122 by using the second storage setup.

In order to preload the programmer's data to memory cells 122 by using threshold voltage distribution curves 412, 422, 432, and 442, storage manager 110 uses either conventional read reference voltages 450, 460, and 470, or unconventional read reference voltages 452, 462, and 472. Depending on which set of read reference voltages is used, storage manager 110 may locate threshold voltage distribution curves 412, 422, 432, and 442 relative to conventional read reference voltages 450, 460, and 470, or relative to unconventional read reference voltages 452, 462, and 472.

Referring to the example shown in FIG. 4A, K=2, information 212 defines a set of four ( ), in this example unconventional, threshold voltage ranges 490, 492, 494 and 496, and information 214 defines a set of three ( ) conventional read reference voltages 450, 460, and 470, or, alternatively, three unconventional read reference voltages 452, 462, and 472. Referencing FIG. 4B, it shows an MBC storage scheme as an exemplary first storage setup scheme for reading the programmer's data from the pertinent memory cells after storage device 100 is embedded in host 170. FIG. 4B also shows an MBC storage scheme as an exemplary second storage setup scheme for rewriting the programmer's data in memory cells after storage device 100 is embedded in host 170. FIG. 4B also demonstrates the adversary effects of the high soldering temperature on the unconventional threshold voltage distribution curves of FIG. 4A. FIG. 4B will be described in association with FIG. 2 and FIG. 4A.

While the host 170 assembly soldering is in progress, the reflow process causes memory cells 122 to lose electric charge. Due to erratic behavior of charge-storing memory cells, the memory cells lose electric charge unevenly. Therefore, after the storage device embedding process is completed, the locations and shapes of unconventional threshold voltage distribution curves 412, 422, 432, and 442 change to the locations and shapes shown in FIG. 4B. Namely, unconventional threshold voltage distribution curve 412 becomes unconventional threshold voltage distribution curve 414; unconventional threshold voltage distribution curve 422 becomes unconventional threshold voltage distribution curve 424; unconventional threshold voltage distribution curve 432 becomes unconventional threshold voltage distribution curve 434; and unconventional threshold voltage distribution curve 442 becomes unconventional threshold voltage distribution curve 444.

By way of example, unconventional threshold voltage distribution curves 414, 424, 434, and 444 respectively reside within, and are narrower than, conventional threshold voltage distribution curve 410, 420, 430, and 440. The deviation of an unconventional threshold voltage distribution curve from the location and shape of the respective conventional threshold voltage distribution curve depends on several factors, among which the empirical estimation mentioned above, soldering temperature; soldering period and the erratic behavior of individual memory cells are predominant. Depending on these factors, after the embedding process is completed, some of the unconventional threshold voltage distribution curves may be located more rightward or more leftward and/or be wider than what is shown in FIG. 4B. For example, unconventional threshold voltage distribution curve 434 may be located closer to read reference voltage 470 and/or be wider.

Because unconventional threshold voltage distribution curves 414, 424, 434, and 444, are respectively similar to the locations of conventional read reference voltages 450, 460 and 470, the programmer's data that was initially preloaded to the first group of memory cells (e.g., group 124) using threshold voltage distribution curves 412, 422, 432 and 442 can be read by storage manager 110 by using conventional read reference voltages 450, 460, and 470. After storage manager 110 reads the programmer's data from the first group of memory cells and temporarily stores it in another memory device (e.g., RAM 150), storage manager 110 conventionally rewrites the programmer's data into memory cells 122 by using conventional threshold voltage distribution curves 410, 420, 430 and 440 and conventional read reference voltages 450, 460 and 470.

Referring to the example shown in FIG. 4A and FIG. 4B, L=K=2, information 220 defines a set of four ( ) conventional threshold voltage ranges 410, 420, 430 and 440, and information 224 defines a set of three ( ) conventional read reference voltages 450, 460, and 470.

Figure 5:
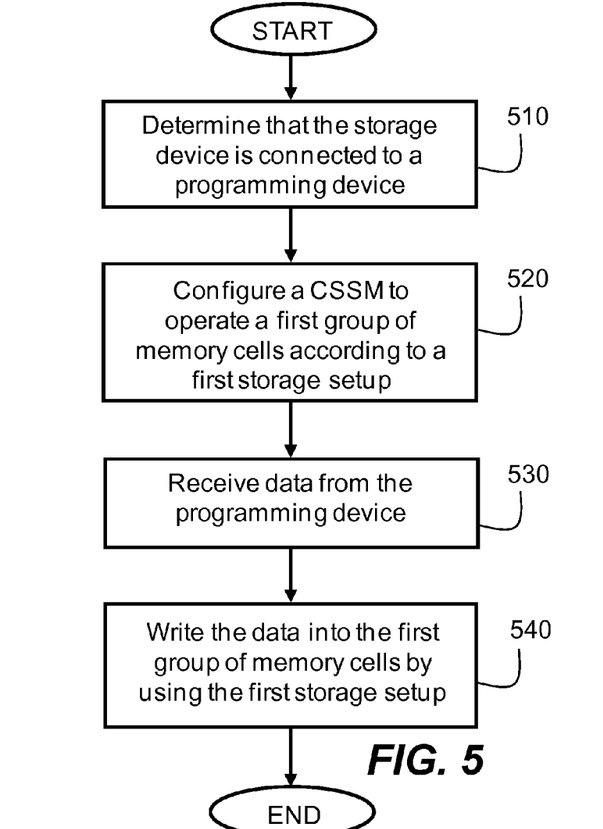
FIG. 5 is a method for preloading programmer data to a storage device according to an example embodiment.

FIG. 5 is a method for preloading data into a storage device according to an example embodiment. FIG. 5 will be described in associated with FIG. 1 and FIG. 2. Assume that a firmware of storage device 100 is stored in a safe and separate memory device (e.g., in ROM 180) and that storage device 100 is connected to programmer 160 in order to receive data from programmer 160. At step 510, storage manager 110 determines that storage device 100 is connected to programmer 160. At step 520, consequent to the determination that storage device 100 is connected to programmer 160, storage manager 110 configures CSSM 130 to operate a first group of memory cells (e.g., group 124) according to a first storage setup. At step 530, storage manager 110 receives the programmer's data (i.e., GPS maps, etc.) from programmer 160 and, at step 540, storage manager 110 uses CSSM 130 to write the programmer's data into group 124 of memory cells by using the first storage setup.

As explained above, the first storage setup enables storage manager 110 to program each memory cell of first group 124 (and also any other memory cell of memory 122 for that matter) to a particular one of binary states, to thereby store K data bits in each memory cell that is so programmed. In general, the second storage setup enables storage manager 110 to program each of memory cells 122 to a particular one of binary states, to thereby store L data bits in each memory cell that is so programmed.

As demonstrated in FIG. 3A and in FIG. 3B, K may equal 1 and L may equal 2. As demonstrated in FIG. 4A and FIG. 4B, K may equal L. If K=L, storage manager 110 applies the first storage setup to write the programmer's data into the first group of memory cells by programming each of the group's memory cells to a particular one of the binary states. Each of the binary states is represented by a particular one of a set of unconventional threshold voltage ranges that differs from a set of conventional threshold voltage ranges that conventionally represent the binary states. Storage manager 110 also applies the first storage setup to read the data from the first group of memory cells by using a set of conventional read reference voltages or a set of unconventional read reference voltages that differs from the set of conventional read reference voltages. After storage manager 110 reads the data by applying the first storage setup (either by using the set of conventional read reference voltages or the set of unconventional read reference voltages), it writes the data into a second group of memory cells (e.g., group 126 or 128, or another group) by applying the second storage setup. Applying the second storage setup includes using the set of conventional threshold voltage ranges and the set of conventional read reference voltages.

Storage manager 110 has several ways to "know" if it is connected to programmer 160, an exemplary programming device, or to host 170: (1) storage manager 110 may receive from programmer 160 information or signal that indicates that the data about to be transferred to it is a programmer data, (2) storage manager 110 may receive an explicit command from programmer 160 to store the data by using the first storage setup, or (3) storage manager 110 may use an internally/locally-based decision making mechanism, as elaborated below.

Storage manager 110 may determine that storage device 100 is connected to programmer 160 autonomously, based/contingent on any one of: a command received from programmer 160, data or specific data string received from programmer 160, and one or more data storage requests that storage manager 110 receives from programmer 160. Storage manager 110 may select the first storage setup as a default storage setup prior to or consequent to receiving first data. (Note: it is assumed that storage manager 110 "knows" if the data it receives for storage in memory cells 122 is "first data", "second data", etc, as it manages the data storage, and, therefore it may assume that the first data is transferred to it from a programming device). Alternatively, programmer 160 notifies storage manager 110 that it is communicating with a programming device and not with a host device. For example, programmer 160 may use a dedicated command or indication to notify storage manger 110 that it is connected to a programming device. Programmer 160 may send such a command or notification to storage manager 110 before programmer 160 commences any data transfer session with storage manager 110. Alternatively, storage manager 110 may know that it is communicating with programmer 160 by detecting a data string (e.g., a specific prefix, a specific suffix, etc.) in the data, or in a metadata associated with the data, which is uniquely used by programming devices but not by hosts.

Figure 6:
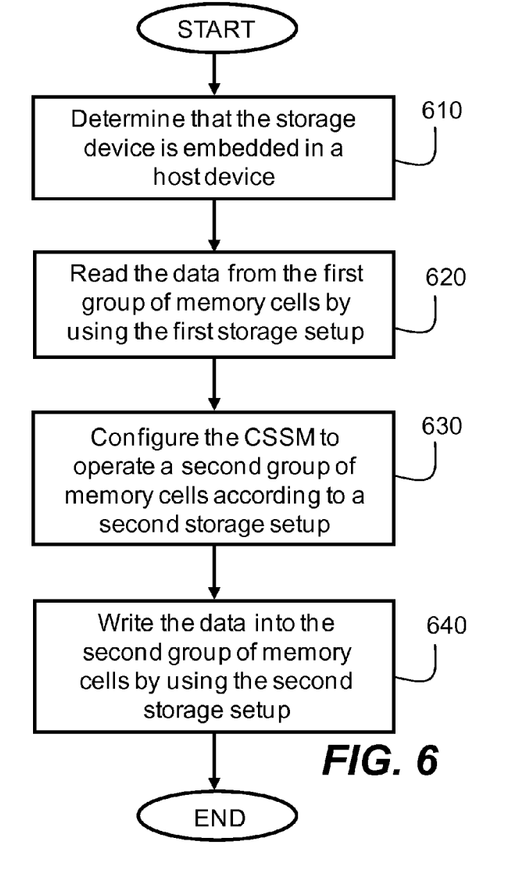
FIG. 6 is a method for rewriting preloaded data into a storage device according to an example embodiment.

FIG. 6 is a method for reconditioning programmer's data that is preloaded in a storage device when the storage device is embedded in a host device according to an example embodiment. FIG. 6 will be described in association with FIG. 1 and FIG. 2. Assume that storage device 100 is embedded in host 170 in order to allow the host's user to use the programmer's data (e.g., GPS maps, video clips and songs, etc.) preloaded into storage device 100 by programmer 160. At step 610, storage manager 110 determines that storage device 100 is embedded in host 170 and contains preloaded data (i.e., programmer's data), and consequent to the determination that storage device 100 is embedded in host 170 and contains the preloaded data, storage manager 110 reads the preloaded data (i.e., programmer's data), at step 620, from the first group of memory cells (e.g., from group 124) by using the first storage setup. (Note: when storage device 100 is connected to programmer 160, storage manager 110 configures CSSM 130 to operate the first group of memory cells according to the first storage setup, and it maintains the first storage setup configuration in order to read the programmer's data from the first group of memory cells after storage device 100 is powered up by host 170.) At step 630, storage manager 110 configures CSSM 130 to operate memory cells 122 according to a second storage setup and, at step 640, storage manager 110 writes the programmer's data, or part thereof (i.e., the part suspected as being susceptible to errors/failures), into a second group of memory cells (e.g., into group 126 or into group 128, or into another group of memory cells within memory 122) by using the second storage setup.

There are several ways by which storage manager 110 may determine that it is connected to host 170 and not to programmer 160: (1) storage manager 110 may receive from host 170 information or signal indicates that it is communicating with a host device, (2) storage manager 110 may receive an explicit command from host 170 to read the programmer's data from the first group of cells by using the first storage setup and to rewrite it into the second group of cells by using the second storage setup, (3) storage manager 110 may use an internally/locally-based decision making mechanism or circuitry, as elaborated below.

Storage manager 110 may determine that storage device 100 is embedded in host 170 autonomously, for example based/contingent on any one of: a command it receives from host 170, data or a specific data string it receives from host 170, and one or more data storage requests, it receives from host 170, which match a predetermined pattern. In order to read the programmer's data from the first group of memory cells, storage manager 110 may initially use the first storage setup as the default storage setup after it is powered up by host 170 or while it communicates with host 170. Assuming that storage manager 110 knows how many times it is powered up, when it is powered up for the second time, storage manager 110 may assume that it is powered up by a host device and not by a programming device. Consequent to the second power up of storage manager 110, storage manager 110 reads the programmer's data, or part thereof, by using the first storage setup, which is initially selected by storage manager 110, and, thereafter, rewrites it by using the second storage setup.

Regarding the programmer's data string mentioned above, if storage manager 110 is communicating with a device and does not receive the unique data string, storage manager 110 assumes that it is communicating with a host device and acts accordingly (i.e., uses the first storage setup to read the data, and the second storage setup to rewrite it). Alternatively, 110 may know that it is communicating with host 170 by receiving from host 170 a data string (e.g., a specific prefix, a specific suffix, etc.) that is uniquely used by host devices and not by programming devices. Alternatively, storage manager 110 may determine that it is connected to host 170 if it receives from host 170 a request to write a second data (i.e., data other than the data preloaded to memory 122 by programmer 160) into one or more memory cells, and these memory cells are accessible by using Logical Block Addressing ("LBA") addresses that exceed a predetermined limit or range. Alternatively, storage manager 110 may determine that it is connected to host 170 if it receives from host 170 a request to write the second data by using LBA address "m" and a subsequent request to write third data using LBA address "n" such that n is less then or equal to m. Alternatively, storage manager 110 may determine that it is connected to host 170 if it receives from host 170 a request to write data using an LBA address which is already in use. Alternatively, storage manager 110 may determine that it is connected to host 170 if it receives from host 170 a request to write an overly sized data into the storage device. "Overly sized data" may be, for example, data whose size is approximately half the size of the storage capacity of the involved storage device. Alternatively, storage device 100 may include an electrical terminal and circuit for generating a signal for storage manager 110 by which storage manager 110 determines whether it is connected to a programming device (e.g., programmer 160) or embedded in a host (e.g., host 170). The signal generated by the electrical terminal and circuit is referred to herein as "connectivity signal". If storage device 100 already stores data when it is powdered up by a host for the first time, storage manager 110 may determine that the data already stored in the storage device is (the) preloaded data (i.e., programmer's data). Storage manager 110 may determine that storage device 100 does not contain preloaded data. Consequent to the determination that storage device 100 does not contain preloaded data, storage manager 110 may configure CSSM 130 to operate, and thereafter operate, memory cells 122 according to the second storage setup.

Figure 7:
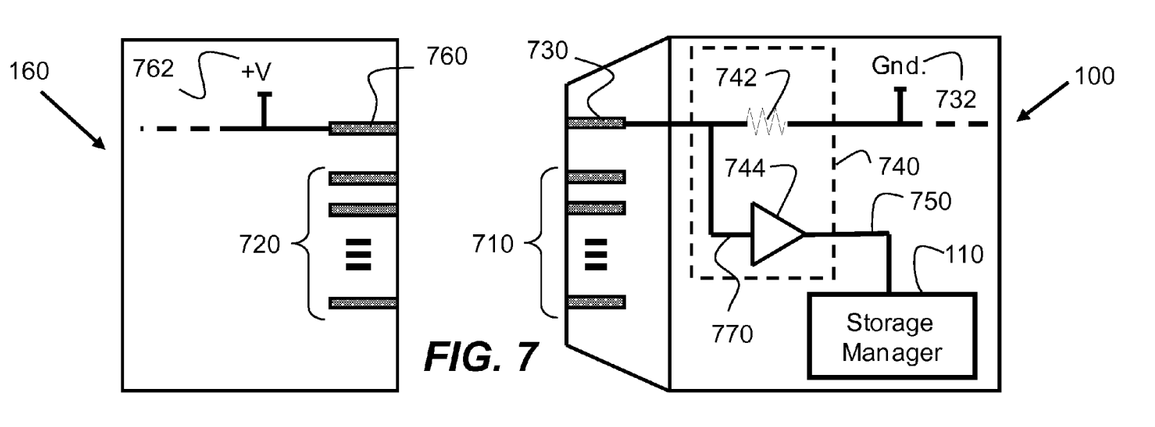
FIG. 7 shows a storage device that is provided with means to detect a connected programming device according to an example embodiment.

FIG. 7 shows an electrical terminal 730 and circuit 740 for generating a connectivity signal 750 for storage manager 110 according to an example embodiment. FIG. 7 will be described in association with FIG. 1. Storage device 100 may include an electrical terminal for receiving a first signal from programmer 160, or from host 170, regarding connection of storage device 100 to programmer 160 or to host 170. Storage device 100 may also include circuitry that is connected to the electrical terminal and to storage manager 110. The circuitry may generate a second signal from the first signal, which indicates to storage manager 110 whether storage device 100 is connected to programmer 160 or to host 170. Referencing FIG. 7, storage device 100 includes a set of conventional terminals 710, and programmer 160 includes a set of conventional terminals 720. When storage device 100 and programmer 160 are connected (in order to preload data to memory 122), each of terminals 710 contacts a terminal of terminals 720. Some of terminals 710 and 720 facilitate transfer of electrical power from programmer 160 to power up storage device 100, and other terminals of terminals 710 and 720 facilitate communication and data transfers between the two devices.

Storage device 100 also includes a terminal 730 and a circuit 740 for generating connectivity signal 750 for storage manager 110. Connectivity signal 750 is switchable between a "High" state and a "Low" state. By way of example, connectivity signal 750 is forced to the "High" state by programmer 160 to thereby indicate to storage manager 110 that storage device 100 is currently connected to a programming device. Connectivity signal 750 is forced to the "Low" state internally when storage device 100 is connected to a device which is not a programming device, for example to host 170. Storage manager 110, therefore, determines whether the storage device 100 is connected to programmer 160 or embedded in host 170 based on whether connectivity signal 750 is in the "High" state or in the "Low" state. Connectivity signal 750 is generated as described below. Programmer 160 includes a terminal 760 that contacts terminal 730 when the two devices are engaged. Terminals 730 and 760 are referred to herein as "connectivity terminals". (Note: unlike storage device 100 and programmer 160, host 170 does not have a connectivity terminal.)

As shown in FIG. 7, connectivity terminal 760 is internally connected to a reference voltage "+V" (e.g., +5V), which is shown at 762. Therefore, when storage device 100 is connected to programmer 160, reference voltage 762 (i.e., the first signal mentioned above) is transferred from connectivity terminal 760 to circuit 740 via connectivity terminal 730. Circuit 740 includes a pull-down resistor 742 and a signal amplifier 744 whose voltage gain (G) may equal 1 (i.e., unity amplifier). Reference voltage 762 is fed to an input terminal 770 of signal amplifier 744, and, assuming that G=1, signal amplifier 744 outputs a voltage (i.e., connectivity signal 750, the second signal mentioned above) whose level is substantially the same level as the level of the input voltage "+V". That is, the connectivity signal 750 is in the "High" state. The value of G may have a value that differs from 1 and, in such a case, the connectivity signal 750 may be thought of as being in the "High" state if its voltage level is greater than a predetermined value (e.g., greater than 60% of the level of reference voltage 762).

Figure 8:
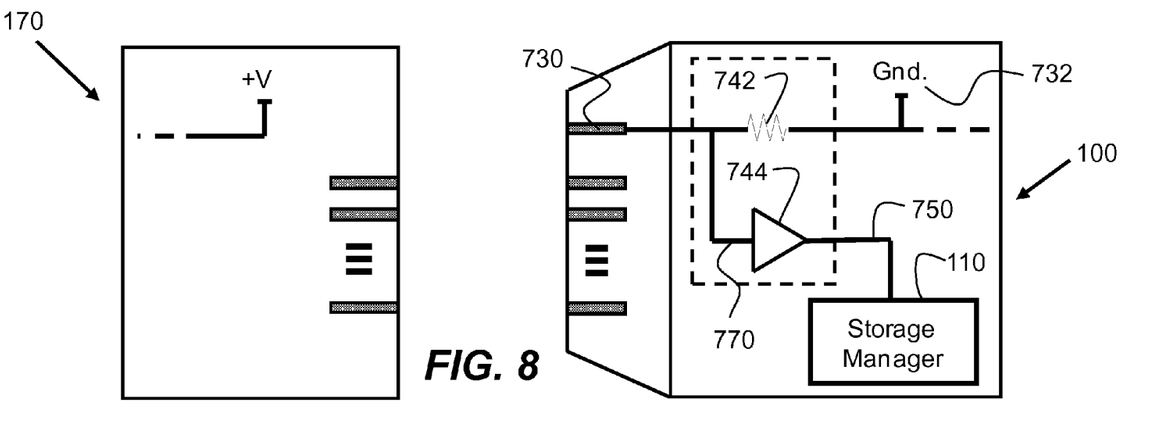
FIG. 8 shows a storage device that is provided with means for detecting a connected device (i.e., programming device or host device) according to an example embodiment.

FIG. 8 shows the storage device of FIG. 7 connected to a host. FIG. 8 will be described in association with FIG. 1 and FIG. 7. When storage device 100 is disconnected from programmer 160 and embedded in host 170, connectivity terminal 730 of storage device 100 is forced to the ground potential (i.e., "Gnd.", shown at 732) through pull-down resistor 742. Consequently, the voltage at input terminal 770 of signal amplifier 744 is substantially zero. Therefore, signal amplifier 744 outputs a voltage (i.e., connectivity signal 750) whose level is substantially zero, which means that the connectivity signal 750 is in the "Low" state.

Electrical circuit 740 may wholly or partly reside in storage manager 110, or it may be external to storage manager 110, as demonstrated in FIGS. 7 and 8. Pull-down resistor 742 may be replaced with a pull-up resistor, and amplifier 744 may be a logical inverter. Depending on the used electrical circuit, storage manager 110 may interpret the "High" state of the connectivity signal 750 as a connection of storage device 100 to a programming device, as described above, or as a connection of storage device 100 to a host device, and storage manager 110 will interpret the "Low" state accordingly. By way of example, the electrical terminal providing the first signal (i.e., electrical terminal 760) resides in programmer 160. However, it can reside in the host device and storage manager 110 may interpret the second signal (e.g., connectivity signal 750) accordingly.

Storage manager 110 can be a standard off-the-shelf System-on-Chip ("SoC") device or a System-in-Package ("SiP") device or general purpose processing unit with specialized software or application (e.g., application 112) that, when executed by storage manager 110, performs the configurations, steps, operations, determinations and evaluations described herein. Alternatively, storage manager 110 can be an Application-Specific Integrated Circuit ("ASIC") that implements the configurations, steps, operations, determination and evaluations described herein by using hardware.

The articles "a" and "an" are used herein to refer to one or to more than one (i.e., to at least one) of the grammatical object of the article, depending on the context. By way of example, depending on the context, "an element" can mean one element or more than one element. The term "including" is used herein to mean, and is used interchangeably with, the phrase "including but not limited to". The terms "or" and "and" are used herein to mean, and are used interchangeably with, the term "and/or," unless context clearly indicates otherwise. The term "such as" is used herein to mean, and is used interchangeably, with the phrase "such as but not limited to".

Note that the foregoing is relevant to various types of mass storage devices such as memory cards, SD-driven flash memory cards, flash storage devices, "Disk-on-Key" devices that are provided with a Universal Serial Bus ("USB") interface, USB Flash Drives (""UFDs"), MultiMedia Card ("MMC"), Secure Digital ("SD"), miniSD and microSD, and so on.

Having thus described exemplary embodiments of the invention, it will be apparent to those skilled in the art that modifications of the disclosed embodiments will be within the scope of the invention. Alternative embodiments may therefore include more modules, fewer modules and/or functionally equivalent modules. Hence the scope of the claims that follow is not limited by the disclosure herein.

What is claimed is:

1. A storage device comprising:
a memory; and
a storage manager configured to determine whether the storage device is electrically coupled to a host and to selectively store data into the memory using a first storage mode or a second storage mode based on the determination of whether the storage device is electrically coupled to a host.

2. The storage device of claim 1, wherein data stored into the memory before the storage device is electrically coupled to the host is stored using the first storage mode and wherein the data is reconditioned by reading the data from the memory and rewriting the data into the memory using the second storage mode after the storage device is electrically coupled to the host.

3. The storage device of claim 1, wherein the memory includes multi-bit cells and wherein the first storage mode includes storing the data into the multi-bit cells using one bit per cell.

4. The storage device of claim 3, wherein the second storage mode includes storing the data into the multi-bit cells using more than one bit per cell.

5. The storage device of claim 4, wherein the second storage mode is used when the storage device is electrically coupled to the host.

6. The storage device of claim 5, wherein when the storage device is electrically coupled to the host and the data was stored into the multi-bit cells using the first storage mode, the data is reconditioned by reading the data from the multi-bit cells and restoring the data into the multi-bit cells using the second storage mode.

7. The storage device of claim 1, wherein the memory includes multi-bit cells and wherein the first storage mode includes storing the data into the multi-bit cells based on a first voltage threshold, the first voltage threshold determining a first set of voltage values for bits stored in the multi-bit cells, and the second storage mode includes storing the data into the multi-bit cells based on a second voltage threshold, the second voltage threshold determining a second set of voltage values for bits stored in the multi-bit cells.

8. A method comprising:
in a data storage device that includes a memory having a plurality of memory elements for storing data:
receiving data to be stored into the memory elements;
selecting a storage mode to store the data into the memory elements from a plurality of storage modes based on whether the data storage device is electrically coupled to a host; and
storing the data into the memory elements using the selected storage mode.

9. The method of claim 8, wherein the data is stored into the memory elements using a first storage mode before the storage device is electrically coupled to the host, and wherein the data is reconditioned by reading the data from the memory elements and rewriting the data into the memory elements using a second storage mode after the storage device is electrically coupled to the host.

10. The method of claim 9, wherein the memory elements are multi-bit cells, and wherein the first storage mode includes storing the data into the memory elements using one bit per data element.

11. The method of claim 10, wherein the second storage mode includes storing the data into the memory elements using more than one bit per data element.

12. The method of claim 11, wherein the second storage mode is used when the storage device is electrically coupled to the host.

13. The method of claim 12, wherein when the storage device is electrically coupled to the host, the data is reconditioned by reading data from the memory elements and restoring the data into the memory elements using the second storage mode.

14. The method of claim 8, wherein the memory elements are multi-bit cells, and wherein a first storage mode includes storing the data into the memory elements based on a first voltage threshold, the first voltage threshold determining a first set of voltage values for bits stored in the memory elements, and a second storage mode includes storing the data into the memory elements based on a second voltage threshold, the second voltage threshold determining a second set of voltage values for bits stored in the memory elements.

15. A storage device comprising:
a memory;
a storage controller coupled to the memory, wherein the storage controller is configured, before the storage device is embedded in a host device:
to receive first data from a programming device when the storage device is operatively coupled to the programming device; and
to write the first data into a first group of elements of the memory by using a first storage setup of a plurality of storage setup options; and
wherein the storage controller is configured, after the storage device is embedded in the host device:
to read at least a portion of the first data from the first group of elements of the memory; and
to rewrite the read portion of the first data into a second group of elements of the memory using a second storage setup.

16. The storage device of claim 15, wherein reading the portion of the first data from the first group of elements of the memory and rewriting the read portion of the first data into a second group of elements of the memory using the second storage setup reconditions the portion of the first data.

17. The storage device of claim 15, wherein the first storage setup facilitates programming multiple bits for each element of the first group of elements of the memory.

18. The storage device of claim 15, wherein the first storage setup comprises a durable data retention storage scheme.

19. The storage device of claim 15, wherein the first storage setup comprises a single-bit per element storage setup.

20. The storage device of claim 15, wherein the first storage setup comprises a multi-bit per element storage setup, wherein the first storage setup utilizes threshold voltage distribution curves associated with binary states of the first group of elements of the memory.

* * * * *